(12) United States Patent
Petersen et al.

(10) Patent No.: US 12,322,734 B2
(45) Date of Patent: Jun. 3, 2025

(54) METHOD FOR PRODUCING AN ELECTRONIC COMPONENT, AND ELECTRONIC COMPONENT

(71) Applicant: OSRAM Opto Semiconductors GmbH, Regensburg (DE)

(72) Inventors: Gunnar Petersen, Regensburg (DE); Daniel Richter, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 430 days.

(21) Appl. No.: 17/630,109

(22) PCT Filed: Jul. 23, 2020

(86) PCT No.: PCT/EP2020/070812
§ 371 (c)(1),
(2) Date: Jan. 25, 2022

(87) PCT Pub. No.: WO2021/018727
PCT Pub. Date: Feb. 4, 2021

(65) Prior Publication Data
US 2022/0367422 A1    Nov. 17, 2022

(30) Foreign Application Priority Data
Jul. 31, 2019 (DE) .......................... 102019120717.7

(51) Int. Cl.
*H01L 25/075* (2006.01)
*H10H 20/01* (2025.01)
(Continued)

(52) U.S. Cl.
CPC ..... *H01L 25/0753* (2013.01); *H10H 20/8506* (2025.01); *H10H 20/854* (2025.01);
(Continued)

(58) Field of Classification Search
CPC ... H01L 25/0753; H01L 33/486; H01L 33/56; H01L 33/62; H01L 2933/005; H01L 2933/0066; H01L 2933/0033; H01L 33/52
See application file for complete search history.

(56) References Cited

U.S. PATENT DOCUMENTS 5,081,520 A  *  1/1992  Yoshii ................. H01L 23/3121
                                                           257/E23.125
9,368,702 B2 *  6/2016  Bierhuizen ............. H01L 33/58
(Continued)

FOREIGN PATENT DOCUMENTS

DE     102013210668 A1   12/2014
DE     102017113745 A1   12/2018
(Continued)

*Primary Examiner* — Kyoung Lee
*Assistant Examiner* — Sophia W Kao
(74) *Attorney, Agent, or Firm* — Slater Matsil, LLP

(57) ABSTRACT

In an embodiment a method includes providing a moldable substrate, applying at least one semiconductor chip to a first main surface of the moldable substrate, introducing the semiconductor chip into the moldable substrate by deforming the moldable substrate such that the semiconductor chip is embedded into the moldable substrate proceeding from the first main surface, wherein at least one electrical contact of the semiconductor chip is freely accessible from an outside, wherein the semiconductor chip is a radiation-emitting flip-chip, and wherein a radiation exit surface of the flip-chip is free of electrical contacts, providing a carrier having at least one electrical connection location on a first main surface and applying the carrier to the first main surface of the moldable substrate after introducing the semiconductor chip into the moldable substrate such that the at least one electrical contact of the semiconductor chip is electrically contacted with the electrical connection location.

18 Claims, 6 Drawing Sheets

(51) Int. Cl.
  *H10H 20/85* (2025.01)
  *H10H 20/854* (2025.01)
  *H10H 20/857* (2025.01)

(52) U.S. Cl.
  CPC ....... *H10H 20/857* (2025.01); *H10H 20/0362* (2025.01); *H10H 20/0364* (2025.01)

(56) References Cited

U.S. PATENT DOCUMENTS

| | | | |
|---|---|---|---|
| 9,577,159 B2* | 2/2017 | Konishi | B29C 48/022 |
| 9,748,514 B2 | 8/2017 | Kostelnik et al. | |
| 10,487,987 B2* | 11/2019 | Jiang | F21K 9/232 |
| 10,837,606 B2* | 11/2020 | Hofmann | H01L 25/0753 |
| 11,808,412 B2* | 11/2023 | Van Bommel | F21K 9/232 |
| 11,841,115 B2* | 12/2023 | Van Bommel | F21K 9/232 |
| 2013/0328100 A1* | 12/2013 | Kono | H01L 33/52 |
| | | | 428/221 |
| 2014/0231850 A1* | 8/2014 | Tischler | H01L 33/501 |
| | | | 257/98 |
| 2015/0041845 A1* | 2/2015 | Schwarz | H01L 33/62 |
| | | | 438/26 |
| 2015/0079709 A1* | 3/2015 | Tischler | H01L 33/486 |
| | | | 438/27 |
| 2016/0172554 A1* | 6/2016 | Basin | H01L 33/505 |
| | | | 438/27 |
| 2019/0259926 A1* | 8/2019 | Musashi | H01L 33/54 |
| 2021/0104649 A1 | 4/2021 | Herrmann | |
| 2022/0390074 A1* | 12/2022 | Van Der Lubbe | F21K 9/232 |

FOREIGN PATENT DOCUMENTS

| | | |
|---|---|---|
| EP | 2535954 A1 | 12/2012 |
| EP | 2674993 A2 | 12/2013 |
| EP | 2902432 A1 | 8/2015 |
| EP | 3022779 A1 | 5/2016 |

\* cited by examiner

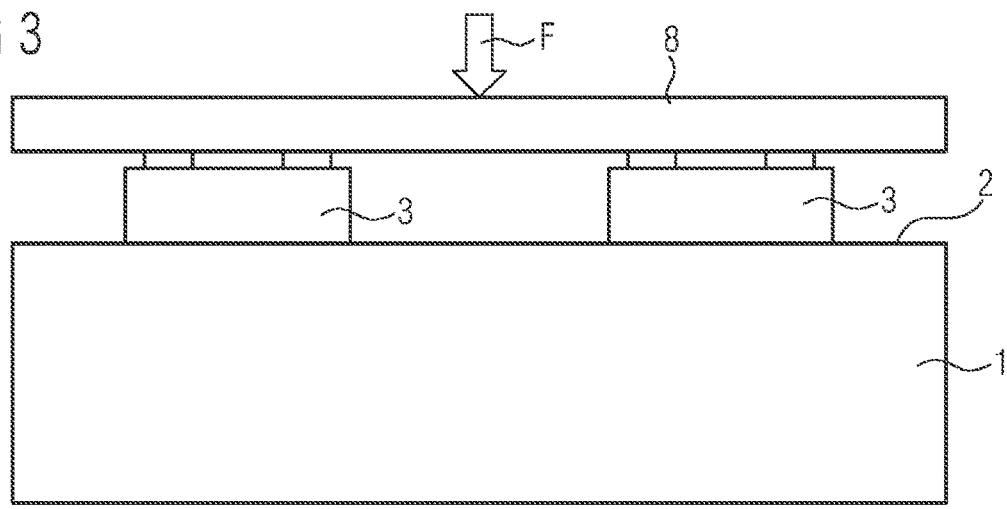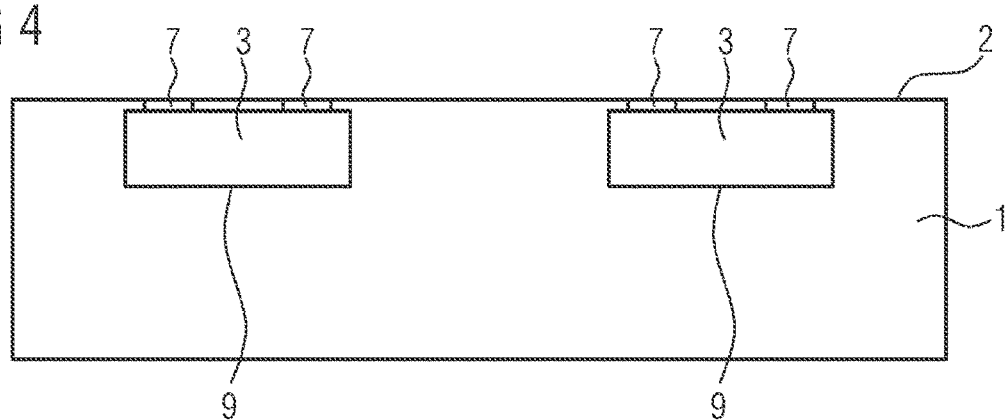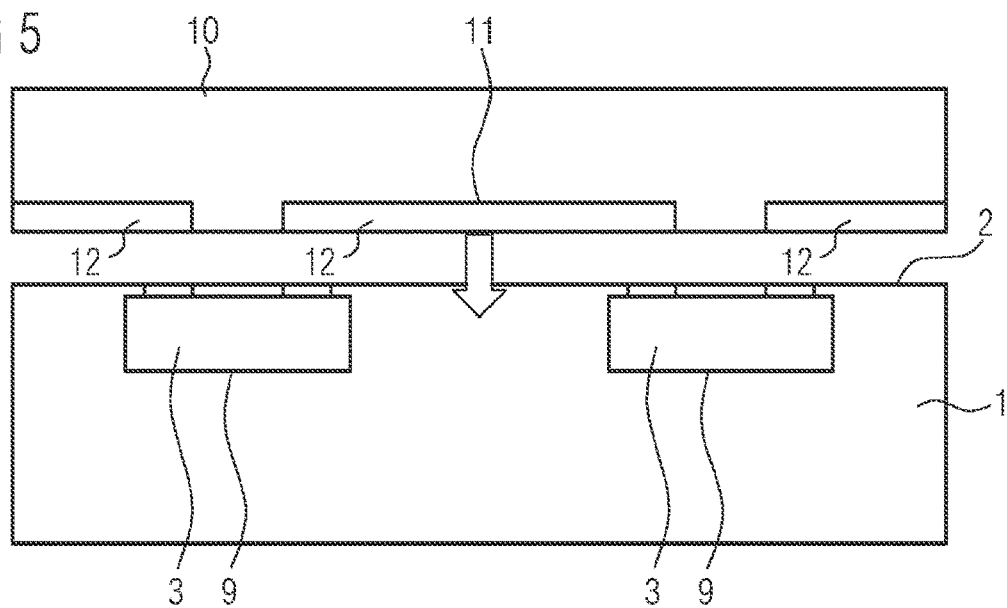

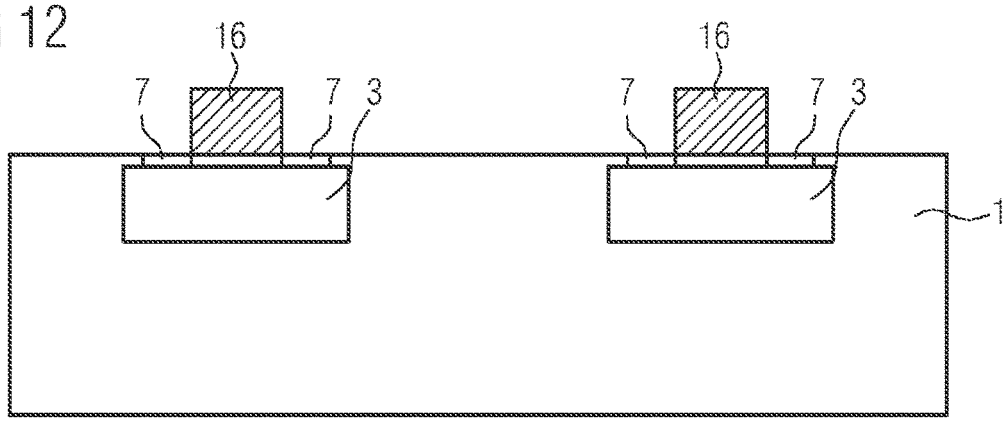
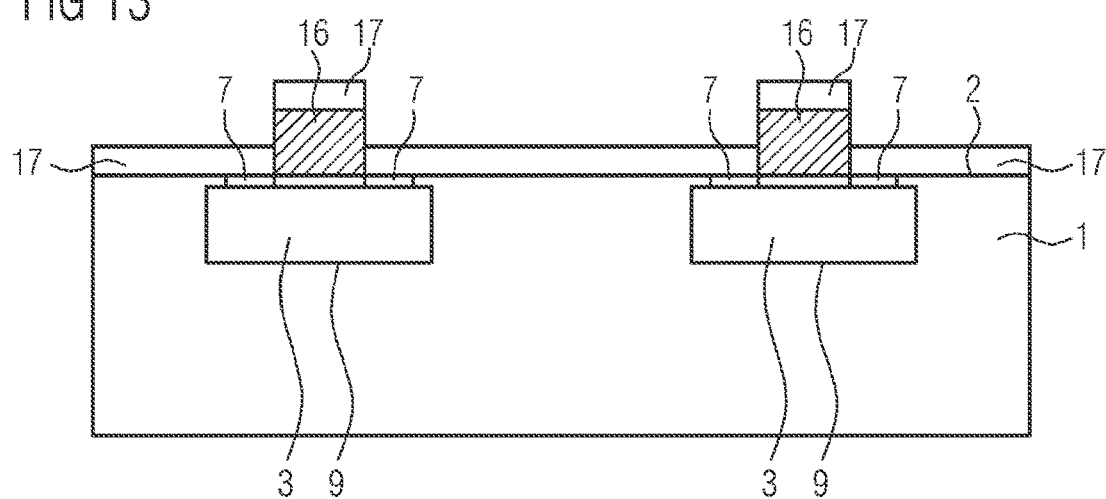
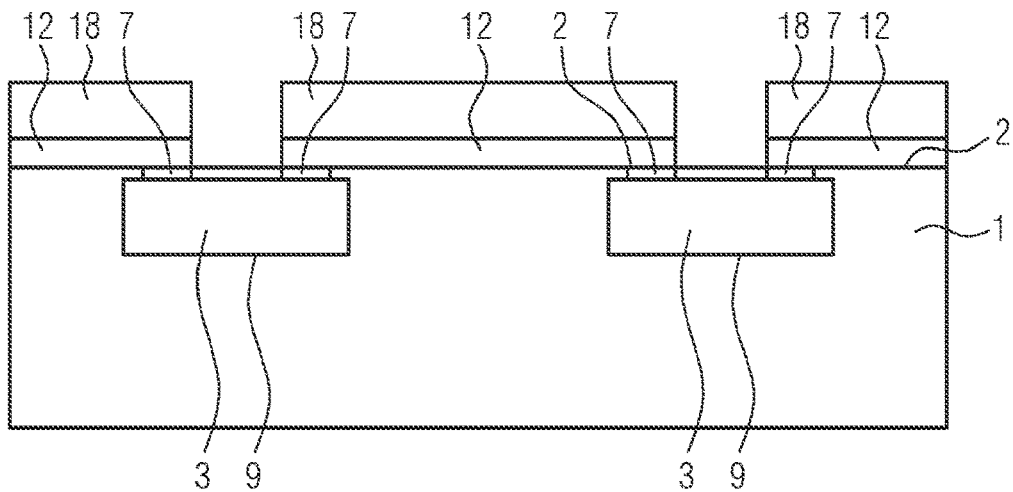

METHOD FOR PRODUCING AN ELECTRONIC COMPONENT, AND ELECTRONIC COMPONENT

This patent application is a national phase filing under section 371 of PCT/EP2020/070812, filed Jul. 23, 2020, which claims the priority of German patent application 10 2019 120 717.7, filed Jul. 31, 2019, each of which is incorporated herein by reference in its entirety.

TECHNICAL FIELD

A method for producing an electronic component, and an electronic component are specified.

SUMMARY OF THE INVENTION

Embodiments provide a simplified production method for an electronic component. Further embodiments provide an electronic component which is particularly simple to produce. Yet further embodiments provide an electronic component having particularly small dimensions and/or to being embodied in at least partly flexible fashion.

Advantageous embodiments and developments of the method for producing an electronic component and of the electronic component are specified in the respective dependent claims.

In accordance with one embodiment of a method for producing an electronic component, a moldable substrate is provided. Preferably, the moldable substrate is configured as a thin moldable layer or as a thin moldable film. The moldable substrate particularly preferably has a main plane of extent. A first main surface of the substrate is arranged parallel to the main plane of extent of the moldable substrate. Preferably, a second main surface is situated opposite the first main surface of the substrate.

In accordance with a further embodiment of the method, at least one semiconductor chip is applied to the first main surface of the moldable substrate. Particularly preferably, a plurality of semiconductor chips is applied to the first main surface of the moldable substrate in a manner spaced apart next to one another.

In accordance with a further embodiment of the method, the semiconductor chip is introduced into the moldable substrate by deforming the moldable substrate, such that the semiconductor chip is embedded into the moldable substrate proceeding from the first main surface. In this case, at least one electrical contact of the semiconductor chip is freely accessible from the outside.

Particularly preferably, apart from the main surface at which the at least one electrical contact is arranged, the outer surface of the semiconductor chip is surrounded by the material of the moldable substrate in a positively locking manner. The main surface of the semiconductor chip at which the at least one electrical contact of the semiconductor chip is arranged is preferably exposed at the first main surface of the moldable substrate.

In accordance with one particularly preferred embodiment of the method, the moldable substrate is a un-crosslinked or a partially crosslinked polymer film. Particularly preferably the moldable substrate is a un-crosslinked or a partially crosslinked silicone film.

The un-crosslinked or partially crosslinked polymer film comprises a plurality of monomers. In the un-crosslinked state of the polymer film, the monomers are not bonded to one another by chemical bonds. During polymerization of the monomers, which is initiated by UV light or heat, for example, the monomers react chemically with one another and form chemical bonds among one another. In the present case, the term "partially crosslinked" means that the monomers of the polymer film are not fully polymerized with one another. The polymerization of the monomers of the polymer film results in the mechanical stability of the polymer film. In general, the mechanical stability of the polymer film increases with the proportion of monomers crosslinked with one another. In other words, the polymer film is moldable all the more easily, the smaller the number of monomers crosslinked with one another.

If polymerization of the monomers of the polymer film progresses further, a majority of the monomers are bonded to one another by chemical bonds. This state of the polymer film is referred to hereinafter as "fully crosslinked".

In accordance with one preferred embodiment of the method, the semiconductor chip is an optoelectronic, preferably radiation-emitting semiconductor chip, particularly preferably of flip-chip design. Particularly preferably, the radiation-emitting semiconductor chip is a light-emitting diode chip. Here and hereinafter, a radiation-emitting semiconductor chip of flip-chip design is also referred to as "flip-chip".

The radiation-emitting semiconductor chip particularly preferably comprises an epitaxial semiconductor layer sequence having an active region suitable for generating electromagnetic radiation during operation. By way of example, the epitaxial semiconductor layer sequence of the radiation-emitting semiconductor chip is based on a nitride compound semiconductor material. Nitride compound semiconductor materials are compound semiconductor materials containing nitrogen, such as the materials from the system $In_xAl_yGa_{1-x-y}N$ where $0 \leq x \leq 1$, $0 \leq y \leq 1$ and $x+y \leq 1$. Such an epitaxial semiconductor layer sequence generally has an active region that generates electromagnetic radiation from the ultraviolet to blue spectral range.

Furthermore, it is also possible for the epitaxial semiconductor layer sequence of the radiation-emitting semiconductor chip to be based on a phosphide compound semiconductor material. Phosphide compound semiconductor materials are compound semiconductor materials containing phosphorus, such as the materials from the system $In_xAl_yGa_{1-x-y}P$ where $0 \leq x \leq 1$, $0 \leq y \leq 1$ and $x+y \leq 1$. Such an epitaxial semiconductor layer sequence generally has an active region which generates electromagnetic radiation from the green to red spectral range.

The epitaxial semiconductor layer sequence is generally grown epitaxially on a growth substrate. The epitaxial semiconductor layer sequence is generally arranged on a carrier element for mechanical stabilization. By way of example, the growth substrate is used as carrier element. Furthermore, it is also possible for the epitaxial semiconductor layer sequence to be transferred from the growth substrate to a carrier element.

Preferably, the carrier element is transmissive at least to the electromagnetic radiation generated in the active region of the epitaxial semiconductor layer sequence. The radiation-emitting semiconductor chip of flip-chip design emits the electromagnetic radiation generated in the active region preferably via a main surface of the carrier element and also side surfaces of the carrier element. In other words, the main surface of the carrier element and also side surfaces of the carrier element form a radiation exit surface of the flip-chip.

The radiation exit surface of the flip-chip is particularly preferably free of electrical contacts. The electrical contacts of the radiation-emitting semiconductor chip of flip-chip design are preferably arranged at a main surface of the epitaxial semiconductor layer sequence facing away from the carrier element.

By way of example, the epitaxial semiconductor layer sequence of the radiation-emitting semiconductor chip of flip-chip design is based on a nitride compound semiconductor material. In this case, the carrier element is preferably the growth substrate of the epitaxial semiconductor layer sequence. The growth substrate particularly preferably comprises sapphire or carbide or consists of one of these two materials. These two materials are advantageously generally transmissive to blue light that is generally generated in an active region of an epitaxial semiconductor layer sequence based on a nitride compound semiconductor material.

By way of example, the epitaxial semiconductor layer sequence of the radiation-emitting semiconductor chip of flip-chip design is based on a phosphide compound semiconductor material. In this case, the carrier element is preferably different than the growth substrate of the epitaxial semiconductor layer sequence. The growth substrate particularly preferably comprises GaAs or consists of this material, while the carrier element of the flip-chip preferably comprises sapphire or carbide or is formed from sapphire or carbide. These two materials are advantageously generally transmissive to green to red light that is generally generated in an active region of an epitaxial semiconductor layer sequence based on a phosphide compound semiconductor material.

In accordance with a further embodiment of the method, the semiconductor chip is a radiation-emitting semiconductor chip of flip-chip design. In this embodiment, the semiconductor chip is applied, by the first main surface of the carrier element, to the first main surface of the moldable substrate before being introduced into the moldable substrate. After being introduced into the moldable substrate, the electrical contacts of the semiconductor chip terminate particularly preferably flush with the first main surface of the moldable substrate. Particularly preferably, the moldable substrate in this embodiment is embodied as transmissive to electromagnetic radiation from at least the active region. By way of example, the moldable substrate transmits 90%, preferably 95%, of the electromagnetic radiation from the active region.

In accordance with a further embodiment, the semiconductor chip is introduced into the moldable substrate by pressing-on using a plate or a roller. For this purpose, the semiconductor chip is firstly applied to the first main surface of the moldable substrate. Particularly preferably, a plurality of semiconductor chips are applied to the first main surface of the moldable substrate in a manner spaced apart next to one another. With the use of a plate, for example a metal plate, this plate is arranged along the first main surface over the semiconductor chips and pressed onto the semiconductor chips with as uniform a pressure as possible, such that the semiconductor chips are pressed into the moldable substrate. The plate enables the semiconductor chips to be introduced into the moldable substrate particularly preferably as uniformly as possible and as far as possible simultaneously.

With the use of a roller, the latter is rolled over the semiconductor chips with as uniform pressure as possible, such that the semiconductor chips are pressed into the moldable substrate. The roller, too, generally enables the semiconductor chips to be introduced into the moldable substrate as uniformly as possible.

In accordance with a further embodiment of the method, the roller and/or the plate have/has a structuring. Height differences can advantageously be compensated for by means of the structuring.

In accordance with a further embodiment of the method, a carrier having at least one electrical connection location on a first main surface is provided. The carrier is applied to the first main surface of the moldable substrate after the process of introducing the semiconductor chip into the moldable substrate, such that at least one electrical contact of the semiconductor chip is electrically contacted with the electrical connection location. Particularly preferably, the electrical connection location of the carrier is in direct contact with the electrical contact of the semiconductor chip.

By way of example, the carrier is a leadframe comprising the at least one electrical connection location. Preferably, the electrical connection location and the leadframe are embodied integrally. The leadframe comprises a metal, for example, or is formed from a metal. By way of example, the leadframe comprises copper or is formed from copper. Furthermore, it is also possible for the leadframe to comprise a core composed of copper that is wholly or partly coated with silver.

Furthermore, the carrier can be a printed circuit board comprising the at least one electrical connection location. The printed circuit board generally also comprises at least one conductor track besides the electrical connection location.

In accordance with a further embodiment of the method, the carrier is pressed into the moldable substrate proceeding from the first main surface. Particularly if the carrier is a leadframe or a printed circuit board, the carrier is preferably pressed into the moldable substrate. Particularly preferably, in this embodiment, the moldable substrate is a partially crosslinked or a un-crosslinked polymer film. Once the carrier has been pressed into the moldable substrate, the partially crosslinked or un-crosslinked polymer film is particularly preferably fully crosslinked, such that the carrier and the moldable substrate are mechanically stably connected to one another.

In accordance with a further embodiment, the carrier can likewise be a un-crosslinked or a partially crosslinked polymer film. In this case, the polymer film used as carrier can be transmissive to electromagnetic radiation, in particular from the semiconductor chip. Furthermore, it is also possible for the polymer film used as carrier to be nontransmissive to electromagnetic radiation, in particular from the semiconductor chip. By way of example, the polymer film used as carrier is embodied such that it is black. Particularly preferably, the moldable substrate and the carrier are a un-crosslinked or a partially crosslinked polymer film, for example a un-crosslinked or a partially crosslinked silicone film. In this embodiment of the method, particularly preferably, the two un-crosslinked or partially crosslinked polymer films are mechanically stably connected to one another by full crosslinking. In this way, a flexible, radiation-transmissive component having very small dimensions can be produced in a simple way.

In accordance with a further embodiment of the method, an electrical contact element is pressed through the polymer film used as carrier, wherein the electrical contact element is freely accessible from the outside. In this case, the polymer film used as carrier can be present in un-crosslinked, partially crosslinked or fully crosslinked fashion.

In accordance with a further embodiment of the method, an adhesive is applied between the moldable substrate and the carrier. The mechanical connection between the moldable substrate and the carrier can advantageously be increased in this way.

In accordance with a further embodiment of the method, an adhesive is applied between the electrical connection location and the moldable substrate, and the carrier is removed again, wherein the electrical connection location remains on the moldable substrate. In this case, the carrier is a film or glass carrier, for example. The carrier is particularly preferably coated with Teflon in order to facilitate removal. In this embodiment, the adhesive is particularly preferably an anisotropic electrically conductive adhesive.

Furthermore, it is also possible for an electrical connection location to be applied to the first main surface of the substrate by means of a photoresist mask, such that at least one electrical contact of the semiconductor chip is electrically contacted with the electrical connection location. In this embodiment, the moldable substrate is preferably cured first.

Then a photoresist layer is applied to the first main surface of the substrate over the whole area and is exposed and developed in such a way that an opening having the desired structure of the connection location arises in the photoresist layer. Then a metallic layer is applied by vapor deposition onto the structured photoresist layer serving as photoresist mask and the photoresist mask is removed again, thus giving rise to the connection location on the first main surface of the substrate. The metallic layer comprises gold or copper, for example, or is formed from one of these materials. Particularly through the use of a photoresist mask, very small semiconductor chips can be electrically contacted in a simple and accurate manner.

In accordance with a further embodiment of the method, the moldable substrate is cured, such that the substrate has mechanically stable properties. In particular, the substrate has no or only very slight moldable properties after curing. Preferably, the curing is effected at the end of the method. Preferably, a un-crosslinked or a partially crosslinked polymer film is used as moldable substrate. The un-crosslinked or partially crosslinked polymer film is generally cured by full crosslinking. In accordance with one embodiment of the method, the un-crosslinked or partially crosslinked polymer film is fully crosslinked by means of UV light and/or heat.

The method described in the present case is advantageously suitable for encapsulating semiconductor chips, in particular radiation-emitting semiconductor chips, in a simple manner and for mechanically stabilizing them. Moreover, various possibilities for simple electrical contacting are specified. The method is simplified and therefore has only low costs.

With the method described here it is possible to produce an electronic component. The electronic component is described in greater detail below. Features and embodiments disclosed only in connection with the method in the present case can also be embodied in the case of the electronic component, and vice versa.

In accordance with one embodiment, the electronic component comprises one or more semiconductor chips. Particularly preferably, the electronic component comprises one or more radiation-emitting semiconductor chips. By way of example, the electronic component comprises at least one red-emitting semiconductor chip, at least one green-emitting semiconductor chip and at least one blue-emitting semiconductor chip.

In accordance with a further embodiment, the electronic component comprises a substrate embodied as a fully cross-linked polymer film. Particularly preferably, the fully crosslinked polymer film is a fully crosslinked silicone film.

In accordance with a further embodiment of the electronic component, the semiconductor chip is embedded into the substrate proceeding from a first main surface of the substrate, wherein at least one electrical contact of the semiconductor chip is freely accessible from the outside.

In accordance with one preferred embodiment of the electronic component, the semiconductor chip is a radiation-emitting semiconductor chip of flip-chip design. The radiation-emitting semiconductor chip emits electromagnetic radiation from a radiation exit surface facing away from the electrical contacts. Particularly preferably, the electrical contacts of the semiconductor chip terminate flush with the first main surface of the substrate.

In accordance with one preferred embodiment of the electronic component, the semiconductor chip is a radiation-emitting flip-chip and the radiation exit surface of the flip-chip is free of electrical contacts.

In accordance with a further embodiment of the electronic component, at least one electrical connection location is arranged on the first main surface of the substrate, such that at least one electrical contact of the semiconductor chip is electrically contacted with the electrical connection location.

In accordance with a further embodiment of the electronic component, the first main surface of the substrate is mechanically stably connected to a carrier. By way of example, the carrier is a fully crosslinked polymer film. The carrier can also be a printed circuit board or a leadframe.

BRIEF DESCRIPTION OF THE DRAWINGS

Further advantageous embodiments and developments of the method and of the electronic component will become apparent from the exemplary embodiments described below in association with the figures.

FIGS. 1 and 3 to 6 show schematic sectional illustrations of method stages of a method for producing an electronic component in accordance with one exemplary embodiment;

FIGS. 10 to 13 show schematic sectional illustrations of method stages of a method for producing an electronic component in accordance with a further exemplary embodiment;

The schematic sectional illustration in FIG. 14 shows an electronic component in accordance with a further exemplary embodiment.

Elements that are identical, of identical type or act identically are provided with the same reference signs in the figures. The figures and the size relationships of the elements illustrated in the figures among one another should not be regarded as to scale. Rather, individual elements, in particular layer thicknesses, may be illustrated with exaggerated size in order to enable better illustration and/or in order to afford a better understanding.

DETAILED DESCRIPTION OF ILLUSTRATIVE EMBODIMENTS

In the method in accordance with the exemplary embodiment in FIGS. 1 to 6, a moldable substrate 1 is provided in a first step. By way of example, the moldable substrate 1 is a un-crosslinked or a partially crosslinked polymer film, particularly preferably a un-crosslinked or a partially crosslinked silicone film.

A plurality of semiconductor chips 3 are applied to a first main surface 2 of the moldable substrate 1 in a manner spaced apart with respect to one another (FIG. 1), only two semiconductor chips 3 being illustrated in the present case for reasons of clarity. The semiconductor chips 3 can be for example electronic semiconductor chips or optoelectronic semiconductor chips. In the present case, the semiconductor chips 3 are radiation-emitting semiconductor chips of flip-chip design.

Figure 2:
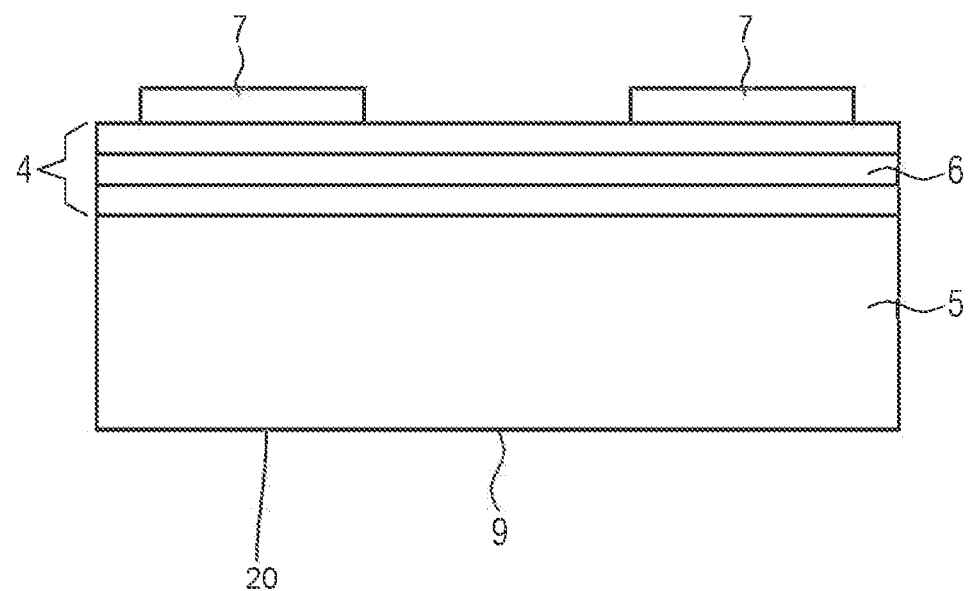
FIG. 2 shows a schematic sectional illustration of a radiation-emitting semiconductor chip of flip-chip design.

The radiation-emitting semiconductor chip 3 of flip-chip design comprises an epitaxial semiconductor layer sequence 4 grown epitaxially on a growth substrate (FIG. 2). The growth substrate serves as a carrier element 5 for the epitaxial semiconductor layer sequence 4 and mechanically stabilizes the epitaxial semiconductor layer sequence 4. The epitaxial semiconductor layer sequence 4 has an active region 6, which generates electromagnetic radiation during the operation of the semiconductor chip 3. In the present case, the epitaxial semiconductor layer sequence 4 is based on a nitride compound semiconductor material and generates visible light from the blue spectral range.

In the present case, the carrier element 5 is based on sapphire or carbide and is transmissive to the blue radiation generated in the active region 6. The semiconductor chip 3 emits the blue radiation generated during operation from the exposed surfaces of the carrier element 5, that is to say from a main surface facing away from the epitaxial semiconductor layer sequence 4, and the side surfaces. Electrical contacts 7 of the semiconductor chip 3 are arranged at the epitaxial semiconductor layer sequence 4, while a radiation exit surface 20 of the semiconductor chip 3 is free of electrical contacts 7.

Furthermore, it is also possible for the radiation-emitting semiconductor chip 3 of flip-chip design to comprise an epitaxial semiconductor layer sequence 4 which is based on a phosphide compound semiconductor material and generates visible light from the red to green spectral range. In this case, the carrier element 5 likewise preferably comprises sapphire or carbide. However, the carrier element 5 is generally not the growth substrate.

Figure 1:
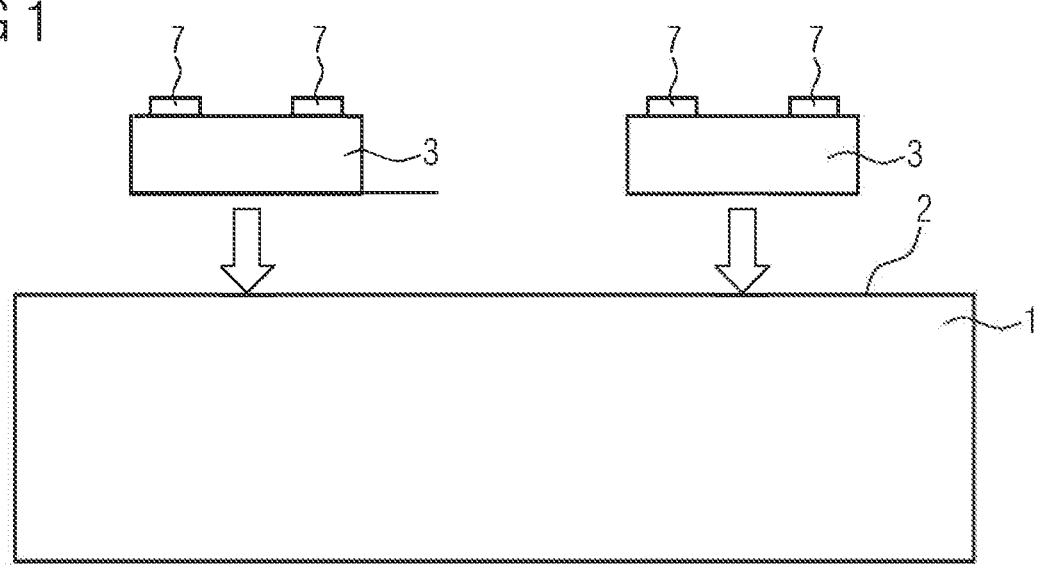

The radiation-emitting semiconductor chips 3 of flip-chip design are applied, by their first main surfaces 9, to the first main surface 2 of the moldable substrate 1. In this case, electrical contacts 7 of the semiconductor chips 3 face away from the first main surface 9 of the moldable substrate 1 (FIG. 1).

In a next step, the semiconductor chips 3 are pressed into the moldable substrate 1 by means of a plate 8, for example a metal plate. In this case, particularly preferably, as constant a force F as possible is exerted on the metal plate, such that the radiation-emitting semiconductor chips 3 are pressed into the moldable substrate 1 uniformly and simultaneously (FIG. 3).

Afterward, the semiconductor chips 3 are embedded into the moldable substrate 1, wherein the electrical contacts 7 of the semiconductor chips 3 are freely accessible from the outside. In the present case, the electrical contacts 7 of the semiconductor chips 3 terminate flush with the moldable substrate 1 (see FIG. 4). Regions of the surface between the electrical contacts 7 are generally likewise free of the moldable substrate 1. At the rest of the surface the semiconductor chips 3 are surrounded by the moldable substrate 1 in each case in a positively locking manner.

Figure 6:
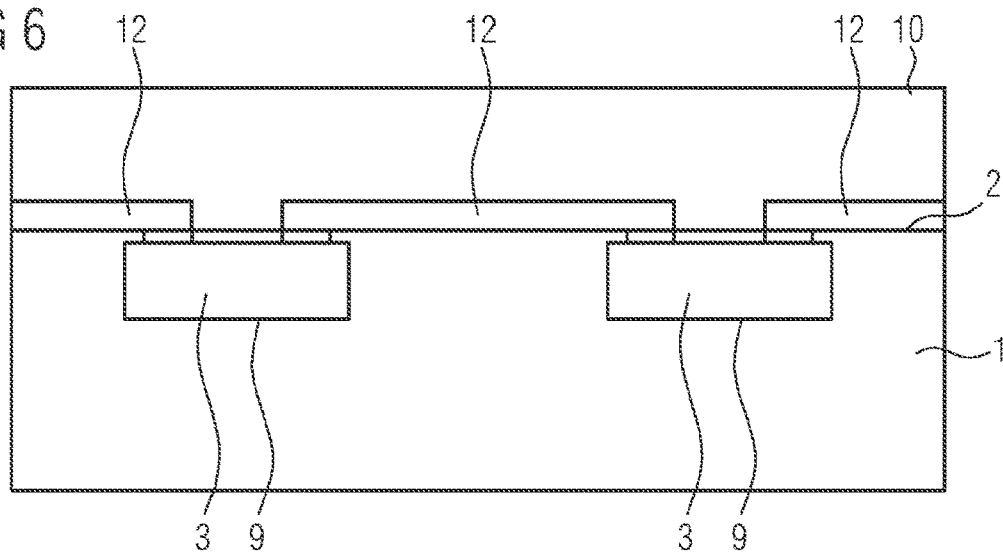

In a further step, a carrier 10 is then applied to the first main surface 2 of the moldable substrate 1 (FIG. 5). By way of example, the carrier 10 is a glass plate coated with Teflon. Electrical connection locations 12 and/or conductor tracks are applied on a first main surface 11 of the carrier 10, said first main surface being coated with Teflon in the present case. The carrier 10 is applied to the first main surface 2 of the moldable substrate 1 in such a way that at least one electrical connection location 12 of the carrier 10 in this case electrically contacts an electrical contact 7 of the semiconductor chips 3 (FIG. 6).

In a next step, in the present exemplary embodiment, the carrier 10 is removed again. This is facilitated by the Teflon coating. The moldable substrate 1 is then cured. In a subsequent step, the resultant assemblage composed of substrate 1 and semiconductor chips 3 is generally singulated to form a plurality of electronic components.

In the method in accordance with this exemplary embodiment, an adhesive layer 13 can also be applied between the electrical connection locations 12 and the carrier 10 and the first main surface 2 of the moldable substrate 1.

Figure 7:
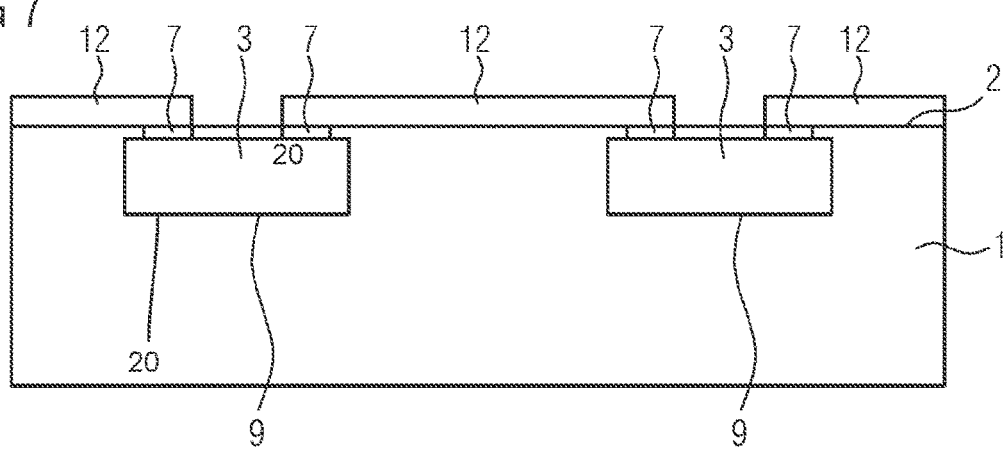
FIG. 7 shows a schematic sectional illustration of an electronic component in accordance with one exemplary embodiment.

The electronic component in accordance with the exemplary embodiment in FIG. 7 comprises two semiconductor chips 3 embedded into a substrate 1. Radiation-emitting semiconductor chips of flip-chip design are used as semiconductor chips 3. A corresponding radiation-emitting semiconductor chip 3 of flip-chip design has already been described with reference to FIG. 2, for example.

In the present case, the substrate 1 is a fully crosslinked polymer film, in particular a fully crosslinked silicone film. The semiconductor chips 3 are embedded into the substrate 1 proceeding from a first main surface 2 of the substrate 1. The rear-side electrical contacts 7 of the semiconductor chips 3 are electrically conductively connected to electrical connection locations 12, via which current can be applied to the semiconductor chip 3 during operation.

During operation, the radiation-emitting semiconductor chip 3 generates electromagnetic radiation, such as blue light, for example, which is emitted into the fully crosslinked polymer film via the radiation exit surface 20. The fully crosslinked polymer film is transmissive to the electromagnetic radiation, for example to the blue light from the semiconductor chips 3, such that the component emits the light from a surface of the polymer film.

In the method in accordance with the exemplary embodiment in FIGS. 8 and 9, firstly the method steps which have already been described with reference to FIGS. 1 to 3 are carried out.

In a next step, a carrier 10 is provided, which is likewise a un-crosslinked or a partially crosslinked polymer film, in particular a un-crosslinked or a partially crosslinked silicone film. Electrical connection locations 12 and conductor tracks are applied on a first main surface 11 of the un-crosslinked or partially crosslinked polymer film, used as carrier 10.

Figure 8:
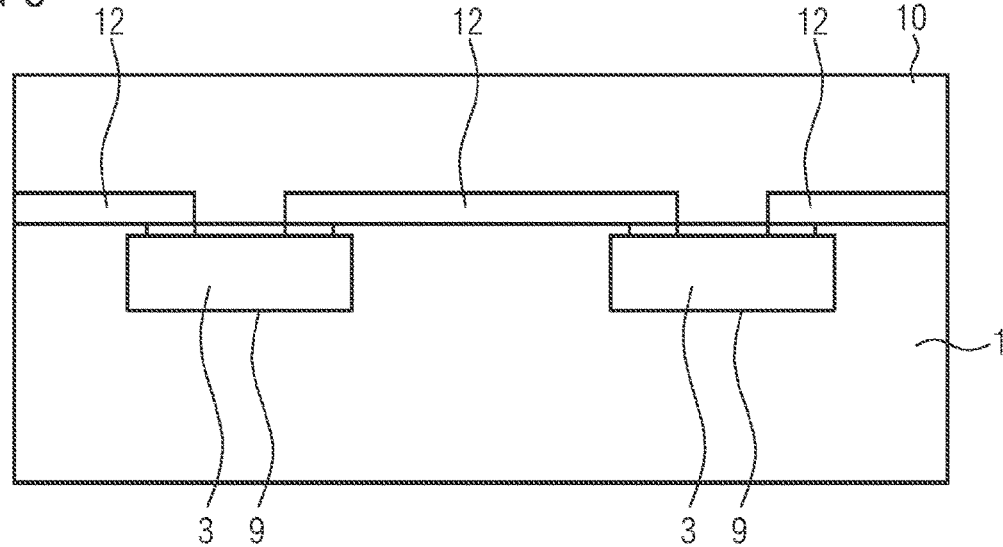
FIGS. 8 to 9 show schematic sectional illustrations of method stages of a method for producing an electronic component in accordance with a further exemplary embodiment.

The un-crosslinked or partially crosslinked polymer film is applied, by the first main surface 11, to the first main surface 2 of the moldable substrate 1 (FIG. 8). The two polymer films are then fully crosslinked. In this case, the two polymer films are mechanically stably bonded to one another. In the present case, the two polymer films are transmissive to electromagnetic radiation generated in the active regions of the semiconductor chips 3. It is also possible for the polymer film used as carrier 10 to be embodied as nontransmissive to radiation.

Figure 9:
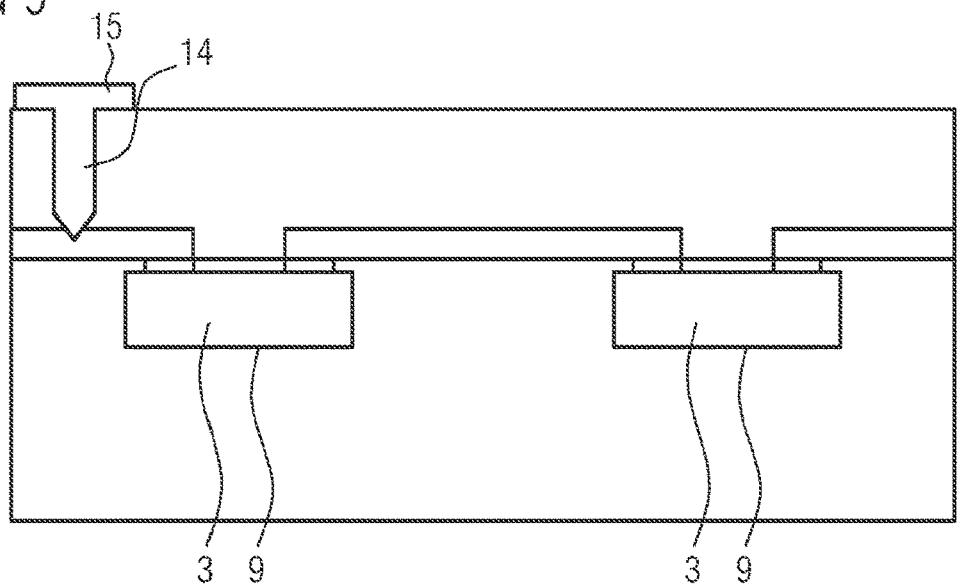

In a next step, illustrated schematically in FIG. 9, an electrical contact element 14, in the present case a metal pin, is pressed through the now fully crosslinked polymer film serving as carrier 10, such that an electrical conductor track on the polymer film serving as carrier 10 is electrically contacted. The electrical contact element 14 has a contact pad 15 arranged on a top surface of the polymer film used as carrier 10. The finished electronic component can be electrically contacted via the contact pad 15.

The electrical contact element 14 can also be introduced into the un-crosslinked or partially crosslinked polymer film used as carrier 10 before the two polymer films are fully crosslinked.

Figure 10:
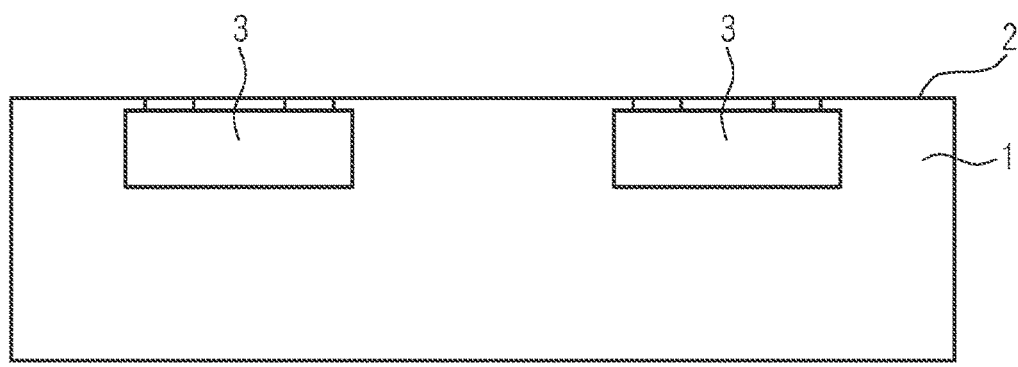
Figure 11:
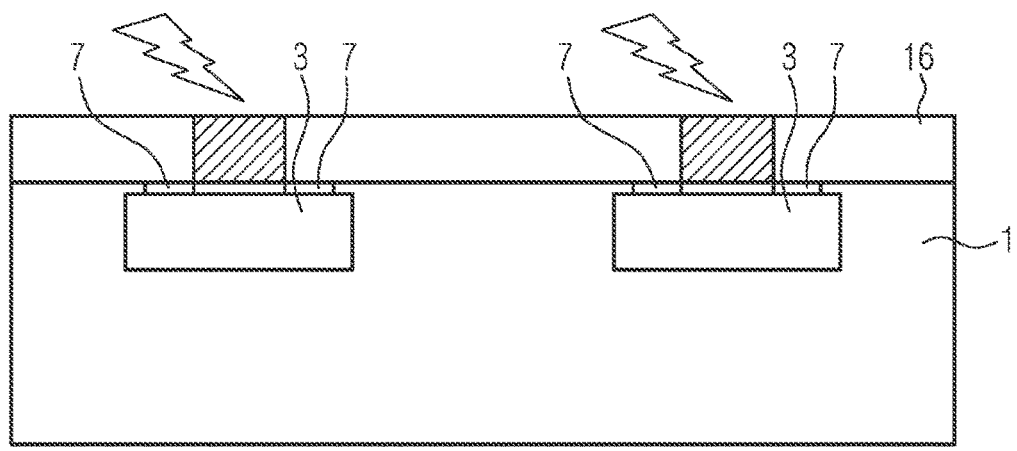

In the method in accordance with the exemplary embodiment in FIGS. 10 to 13, firstly the method steps such as have already been described with reference to FIGS. 1 to 3 are carried out. The moldable substrate 1 is then cured (FIG. 10).

In order to produce electrical contact structures comprising at least one electrical connection location 12, a photoresist layer 16 is firstly applied to the first main surface 2 of the substrate 1 over the whole area and exposed (FIG. 11) through a mask (not illustrated).

The photoresist layer 16 is then developed, such that regions between the electrical contacts 7 of the semiconductor chips 3 embodied as flip-chips are covered with the photoresist layer 16, while the rest of the first main surface 2 of the substrate 1 is free of the photoresist layer 16 (FIG. 12). The structured photoresist layer serves as photoresist mask 16.

In a next step, firstly over the whole area a metallic layer 17 is deposited on the structured photoresist layer 16, for example by sputtering (FIG. 13). The metallic layer 17 comprises gold or copper, for example, or is formed from one of these materials.

The photoresist mask 16 is then removed again, such that electrical connection locations 12 and/or conductor tracks are formed on the first main surface 2 of the substrate 1. In a next step, the electrical connection locations 12 and/or conductor tracks are mechanically reinforced by electrodeposition of a further metallic layer 18.

The electronic component in accordance with the exemplary embodiment in FIG. 14 can be produced by the method which has already been described with reference to FIGS. 10 to 13.

The electronic component in accordance with the exemplary embodiment in FIG. 14 comprises two radiation-emitting semiconductor chips 3 of flip-chip design such as have already been described by way of example with reference to FIG. 2. The rear-side electrical contacts 7 of the semiconductor chips 3 are electrically conductively connected to electrical connection locations 12 and/or conductor tracks. In the present case, the electrical connection locations 12 and/or conductor tracks are mechanically reinforced by an electrodeposited further metallic layer 18.

In the method in accordance with the exemplary embodiment in FIGS. 15 to 17, once again the method steps such as have already been described with reference to FIGS. 1 to 3 are carried out (FIG. 15).

Figure 16:
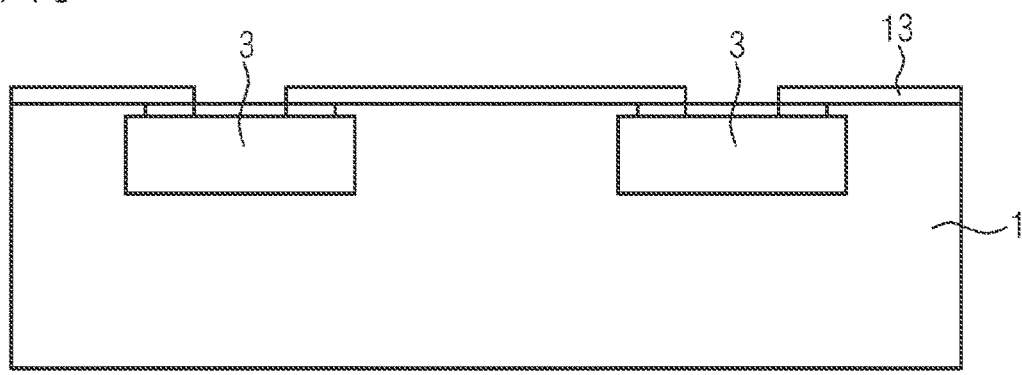

In a next step, an adhesive 13 in the form of a thin layer is applied to the first main surface 2 of the moldable substrate 1 (FIG. 16).

In a next step, a leadframe 19 is then applied to the first main surface 2 of the moldable substrate 1, said first main surface having been provided with the adhesive 13. The leadframe 19 is then pressed into the moldable substrate 1.

In a next step, the un-crosslinked or partially crosslinked polymer film used as moldable substrate 1 is cured by its being fully crosslinked. The adhesive 13 is also cured. In this way, the leadframe 19 is connected to the substrate 1 in a positively locking and mechanically stable manner (FIG. 17).

Figure 15:
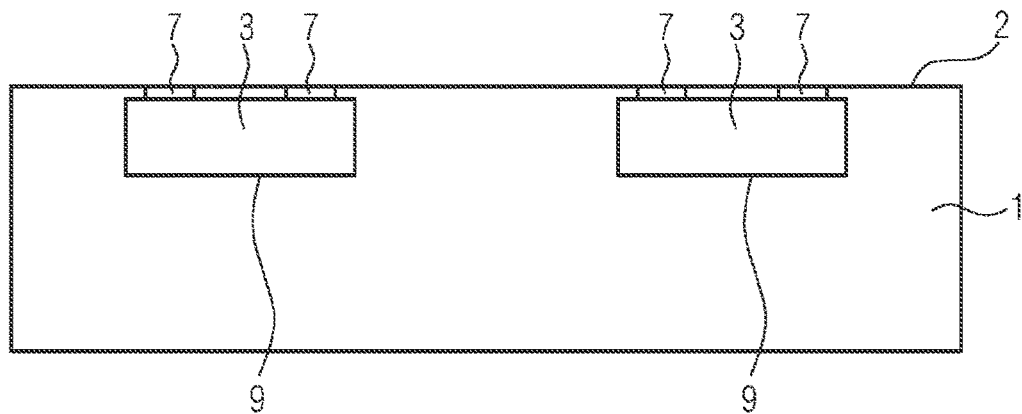
FIGS. 15 to 17 show schematic sectional illustrations of method stages of a method for producing an electronic component in accordance with a further exemplary embodiment.
Figure 17:
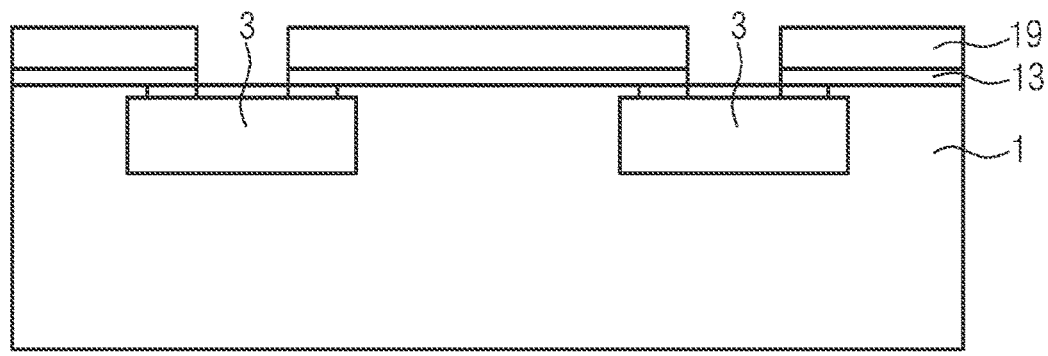

The method in accordance with the exemplary embodiment in FIGS. 15 to 17 can also be carried out without the adhesive layer 13. In this case, the leadframe 19 is pressed directly into the first main surface 2 of the moldable substrate 1 and, by means of full crosslinking of the polymer film, is mechanically stably connected thereto.

In the method in accordance with the exemplary embodiment in FIGS. 15 to 16, a printed circuit board can also be used instead of the leadframe 19.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A method for producing an electronic component, the method comprising:
    providing a moldable substrate being an un-crosslinked or a partially crosslinked film;
    applying at least one semiconductor chip to a first main surface of the moldable substrate;
    introducing the semiconductor chip into the moldable substrate by deforming the moldable substrate such that the semiconductor chip is embedded into the moldable substrate proceeding from the first main surface, wherein at least one electrical contact of the semiconductor chip is freely accessible from an outside, wherein the semiconductor chip is a radiation-emitting flip-chip, and wherein a radiation exit surface of the flip-chip is free of electrical contacts;
    providing a carrier being an un-crosslinked or a partially crosslinked polymer film and having at least one electrical connection location on a first main surface;
    applying the carrier to the first main surface of the moldable substrate after introducing the semiconductor chip into the moldable substrate such that the at least one electrical contact of the semiconductor chip is electrically contacted with the electrical connection location; and
    connecting the moldable substrate and the carrier to one another by full crosslinking.

2. The method of claim 1,
    wherein the semiconductor chip is applied, by a first main surface, to the first main surface of the moldable substrate before being introduced into the moldable substrate, and
    wherein the electrical contacts of the semiconductor chip, after being introduced into the moldable substrate, terminate flush with the first main surface of the moldable substrate.

3. The method of claim 1, wherein the semiconductor chip is introduced into the moldable substrate by pressing using a plate or a roller.

4. The method of claim 1,
wherein the moldable substrate is a polymer film, and wherein the carrier is a polymer film.

5. An electronic component comprising:
a semiconductor chip;
a substrate embodied as a fully crosslinked polymer film, wherein the semiconductor chip is embedded into the substrate proceeding from a first main surface of the substrate, wherein at least one electrical contact of the semiconductor chip is freely accessible from an outside, wherein the semiconductor chip is a radiation-emitting flip-chip, and wherein a radiation exit surface of the flip-chip is free of electrical contacts; and
a carrier having at least one electrical connection location on a first main surface,
wherein the carrier is located at the first main surface of the substrate such that the at least one electrical contact of the semiconductor chip embedded in the substrate is electrically contacted with the electrical connection location, and
wherein the carrier and the substrate are directly and stably connected to one another based on full cross-linking.

6. The electronic component of claim 5, wherein the electrical contacts of the semiconductor chip terminate flush with the first main surface of the substrate.

7. The electronic component of claim 5, wherein the at least one electrical connection location is arranged on the first main surface of the substrate such that the at least one electrical contact of the semiconductor chip is electrically contacted with the electrical connection location.

8. The electronic component of claim 5, wherein the first main surface of the substrate is stably connected to the carrier.

9. The electronic component of claim 5, wherein the carrier is a fully crosslinked polymer film.

10. A method for producing an electronic component, the method comprising:
providing a moldable substrate;
applying at least one semiconductor chip to a first main surface of the moldable substrate;
introducing the semiconductor chip into the moldable substrate by deforming the moldable substrate such that the semiconductor chip is embedded into the moldable substrate proceeding from the first main surface, wherein at least one electrical contact of the semiconductor chip is freely accessible from an outside, wherein the semiconductor chip is a radiation-emitting flip-chip, and wherein a radiation exit surface of the flip-chip is free of electrical contacts;
providing a carrier having at least one electrical connection location on a first main surface;
applying the carrier to the first main surface of the moldable substrate after introducing the semiconductor chip into the moldable substrate such that the at least one electrical contact of the semiconductor chip is electrically contacted with the electrical connection location;
applying an adhesive between the electrical connection location and the moldable substrate; and
removing the carrier so that the electrical connection location remains on the moldable substrate.

11. The method of claim 10, wherein each of the moldable substrate and the carrier is an un-crosslinked or a partially crosslinked polymer film, and wherein the method further comprises stably connecting the moldable substrate and the carrier by full crosslinking.

12. The method of claim 10, wherein the adhesive is an anisotropic electrically conductive adhesive.

13. The method of claim 12, further comprising curing the adhesive.

14. The method of claim 10, wherein the semiconductor chip is introduced into the moldable substrate by pressing using a plate or a roller.

15. The method of claim 10,
wherein the carrier is a leadframe or a printed circuit board comprising the at least one electrical connection location, and
wherein the carrier is pressed into the moldable substrate.

16. The method of claim 14, wherein the carrier is a polymer film.

17. A method for producing an electronic component, the method comprising:
providing a moldable substrate;
applying at least one semiconductor chip to a first main surface of the moldable substrate;
introducing the semiconductor chip into the moldable substrate by deforming the moldable substrate such that the semiconductor chip is embedded into the moldable substrate proceeding from the first main surface, wherein at least one electrical contact of the semiconductor chip is freely accessible from an outside, wherein the semiconductor chip is a radiation-emitting flip-chip, and wherein a radiation exit surface of the flip-chip is free of electrical contacts;
providing a carrier having at least one electrical connection location on a first main surface;
applying the carrier to the first main surface of the moldable substrate after introducing the semiconductor chip into the moldable substrate such that the at least one electrical contact of the semiconductor chip is electrically contacted with the electrical connection location; and
pressing an electrical contact element through the carrier such that the electrical contact element is freely accessible from the outside.

18. The method of claim 17, wherein the semiconductor chip is introduced into the moldable substrate by pressing using a plate or a roller.

* * * * *